United States Patent [19]

Shimizu et al.

[11] Patent Number: 5,225,701
[45] Date of Patent: Jul. 6, 1993

[54] VERTICAL SILICON-ON-INSULATOR (SOI) MOS TYPE FIELD EFFECT TRANSISTOR

[75] Inventors: Masahiro Shimizu; Tachihisa Yamaguchi, both of Itamishi, Japan

[73] Assignee: Mitsubishi Denki Kabushiki Kaisha, Tokyo, Japan

[21] Appl. No.: 626,052

[22] Filed: Dec. 13, 1990

[30] Foreign Application Priority Data

Dec. 15, 1989 [JP]  Japan .................................. 1-326654

[51] Int. Cl.⁵ ...................... H01L 27/01; H01L 29/76
[52] U.S. Cl. .................................... 257/347; 257/351; 257/369; 257/401; 257/408
[58] Field of Search ............... 357/23.3, 23.4, 23.7, 357/42, 55

[56] References Cited

U.S. PATENT DOCUMENTS

| | | | |
|---|---|---|---|
| 4,670,768 | 6/1987 | Sunami et al. | 357/23.4 |
| 4,975,754 | 12/1990 | Ishiuchi et al. | 357/55 |
| 5,047,812 | 9/1991 | Pfiester | 357/55 |
| 5,057,896 | 10/1991 | Gotou | 357/55 |
| 5,060,029 | 10/1991 | Nishizawa et al. | 357/23.4 |

FOREIGN PATENT DOCUMENTS

| | | | |
|---|---|---|---|
| 59-204280 | 11/1984 | Japan | 357/23.4 |
| 61-89674 | 5/1986 | Japan | 357/23.4 |
| 1-268172 | 10/1989 | Japan | 357/23.4 |
| 1-293666 | 11/1989 | Japan | 357/23.4 |
| 2-52469 | 2/1990 | Japan | 357/23.4 |

WO90/13918 11/1990 PCT Int'l Appl. ............... 357/23.4

OTHER PUBLICATIONS

Hamdi et al., "Novel SOI CMOS Design Using Ultra Thin Near Intrinsic Substrate", IEDM 82, pp. 107–110.
Jean-Pierre Colinge, "Reduction of Kink Effect in Thin-Film SOI MOSFET's", *IEEE Electron Device Letters*, vol. 9, No. 2, Feb. 1988, pp. 97–99.

*Primary Examiner*—Rolf Hille
*Assistant Examiner*—Steven Loke
*Attorney, Agent, or Firm*—Lowe, Price, LeBlanc & Becker

[57] ABSTRACT

A MOS type field effect transistor includes a columnar insulation layer (22) formed in a concave portion of semiconductor layer (23) that is formed on a main surface of a semiconductor substrate (21). A first source or drain area (25) is formed annularly in the main surface of the substrate (21) and outwardly from an outer circumferential surface of the semiconductor layer (23), and is connected to one end of a channel (24) of the semiconductor layer (23). A second source or drain area (26) is formed on an upper end of the semiconductor layer (23), and is connected to the other end of the channel (24). A cylindrical gate electrode (28) is formed to surround the outer circumferential surface of the semiconductor layer (23). Insulation layer (22) within semiconductor layer (23) constitutes a vertical SOI device.

5 Claims, 9 Drawing Sheets

VERTICAL SILICON-ON-INSULATOR (SOI) MOS TYPE FIELD EFFECT TRANSISTOR

BACKGROUND OF THE INVENTION

1. Field of the Invention

The present invention relates to a MOS type field effect transistor and a manufacturing method thereof and, more particularly, to a MOS type field efect transistor having a channel area provided with thin film and a manufacturing method of such a transistor.

2. Description of the Background Art

It has been recently demanded to establish microtechnology as the density and integration tend to increase in the MOS type field effect transistor (hereinafter abbreviated as "MOSFET") in which a source for supplying a carrier and a drain for taking out the carrier are located on both sides of a capacitor consisting of a metal-oxide film-semiconductor structure provided with a metal electrode on a silicon semiconductor substrate by means of oxide film.

Incidentally, because parasitic capacity is formed inside the MOSFET owing to its structure and the time for charging and discharging of the parasitic capacity determines the operating speed of the MOSFET, it becomes possible to operate the MOSFET at high speed by minimizing the parasitic capacity.

Figure 5A:
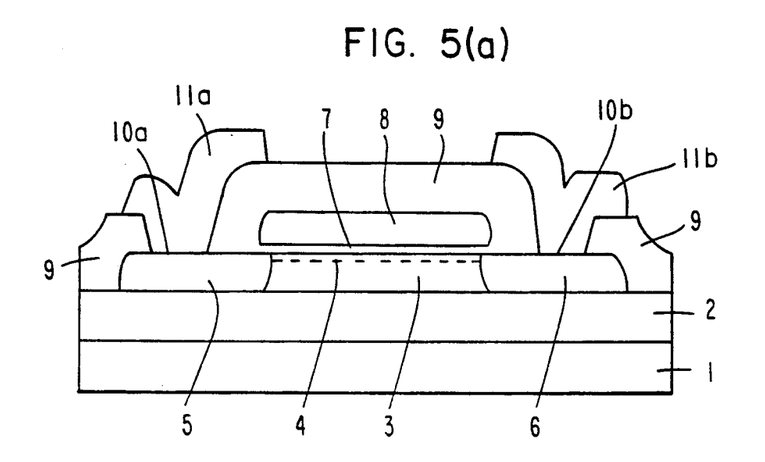
Figure 5B:
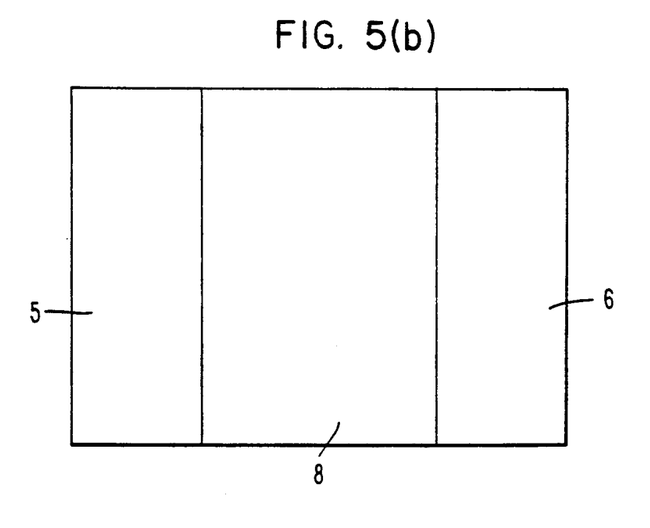

The MOSFET is now required to have a novel structure for achieving high speed operation through miniaturization. As an example of such a novel structure, there is an SOI (Silicon On Insulator) structure in which a channel area is provided with thin film to reduce the parasitic capacity between the source and substrate as well as between the drain and substrate. FIG. 5 is a structural sectional view and a plan view illustrating a conventional n-channel MOSFET having an SOI structure.

In this drawing, the reference numeral (1) indicates a P-type silicon semiconductor substrate having the density of $1 \times 10^{15} cm^{-3}$, and the specific resistance of $10 \Omega.cm$; numeral (2) indicates an insulator layer formed on one main surface of the foregoing P-type silicon semiconductor substrate(1); numeral (3) indicates a P-type silicon semiconductor layer having the density of $1 \times 10^{15} cm^{-3}$ and the specific resistance of $10\Omega.cm$ formed on the main surface which does not contact the foregoing P-type silicon semiconductor substrate (1) of the foregoing insulator (2); numeral (4) indicates a channel area having the density of $1 \times 10^{16}$ to $1 \times 10^{17} cm^{-3}$; formed by injecting boron ions into the foregoing P-type silicon semiconductor layer (3) with the acceleration voltage of 10 to 30 Kev and the dose of $1 \times 10^{12}$ to $1 \times 10^{14} cm^{-2}$; numeral (5) indicates an n+ type source area having the density of $1 \times 10^{19}$ to $1 \times 10^{21} cm^{-3}$ formed to cause the bottom thereof to contact the foregoing insulator layer (2) by injecting arsenic ions into the foregoing P-type silicon semiconductor layer (3) with the acceleration voltage of 40 Kev and the dose of $5 \times 10^{15} cm^{-2}$; numeral (6), like the foregoing n+ type source area (5), indicates an n+ type drain area having the density of $1 \times 10^{19}$ to $1 \times 10^{21} cm^{-3}$ formed to cause the bottom thereof to contact the foregoing insulator layer (2) by injecting arsenic ions into the foregoing P-type silicon semiconductor layer (3) with the acceleration voltage of 40 Kev and the dose of $5 \times 10^{15} cm^{-2}$; numeral (7) indicates a gate dielectric thin film formed on the main surface which does not contact the foregoing insulator layer (2) of the foregoing P-type silicon semiconductor layer (3); numeral (8) indicates a gate electrode formed on the foregoing gate dielectric thin film (7); numeral (9) indicates a layer insulation film formed to cover the foregoing P-type silicon semiconductor layer (3) and the foregoing gate electrode (8); numeral (10a) is a first contact hole provided on the foregoing n+ type source area; numeral (10b), like the foregoing first contact hole (10a), indicates a second contact hole provided on the foregoing n+ type drain area (6); numeral (11a) indicates a first wiring of aluminum alloy formed in the foregoing first contact hole (10a); and (11b), like the foregoing second contact hole (11a), indicates a second wiring of aluminum alloy formed in the foregoing second contact hole (10b).

Since the conventional n channel MOSFET is composed in a manner mentioned above, when a voltage over the threshold is applied to the gate electrode (8), the electron which is the carrier of the n-type semiconductor is drawn toward the surface of the channel area (4), changing the surface into the same n-type as that of the n+ type source area (5) and the n+ type drain area (6). Therefore, current flows between the n+ type source area (5) and the n+ type drain area (6). Because the density of the carrier drawn to the surface of the channel area (4) varies depending upon the voltage applied to the gate electrode (8), the amount of current flowing through the channel area (4) can be controlled by the voltage to be applied to the gate electrode (8).

PROBLEMS TO BE SOLVED BY THE INVENTION

In the conventional n-channel MOSFET whose channel area is provided with thin film as mentioned above, if the P-type silicon semiconductor layer (3) is relatively thin (about 5000 Å) and the gap between the n+ type source area (5) and the n+ type drain area (6) is reduced, the voltage to be applied to the n+ type drain area (6) may rise and the depletion layer in the vicinity of the n+ type drain area (6) may extend up to the n+ type source area (5). When the depletion layer extends up to the n+ type source area (5), the electric trouble between the n+ type source area (5) and the channel area (4) is reduced, and a large amount of current flows out to a deep area (the area of the lower part of 2000 to 4000 Å) from the surface of the P-type silicon semiconductor layer (3), resulting in a "punch through" in which the operation of the MOSFET is lost. This punch through restricts the voltage that can be applied to the n+ type drain area (6), and the dielectric strength between the n+ type source area (5) and the n type drain area (6) is caused to be reduced.

Figure 6:
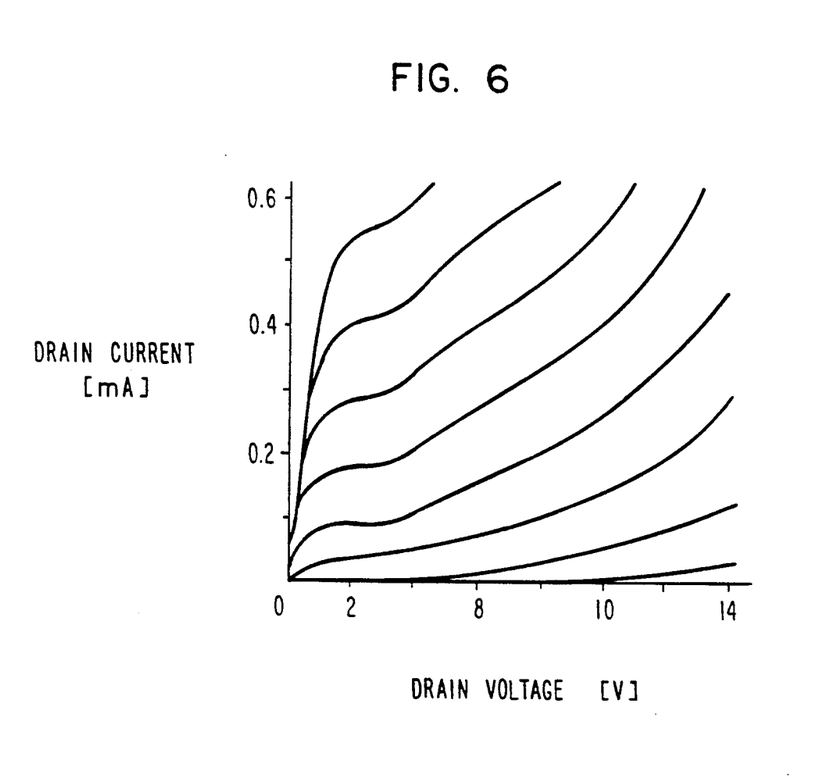

On the other hand, the voltage that is applied to the n+ type drain area (6) rises with the resultant increase in the electric field intensity in the P-type silicon semiconductor layer (3), and in particular, a high electric field emerges in the depletion layer in the vicinity of the n+ type drain area (6). The electron of the channel area (4) is accelerated by the high electric field in the vicinity of this n+ type drain area (6) and injected into the depletion layer in the vicinity of the n+ type drain area (6), causing the ionization by collision of the grid of silicon thereby generating a lot of pairs of electron and positive hole. The generated electron is further drawn toward the high electric field in the vicinity of the n+ type drain area (6) and the most part of the electron flows into the n+ type drain area (6). In the meantime, the positive hole flows in from the depletion layer in the vicinity of the n+ type drain area (6) to be accumulated on the bottom of the P-type silicon semiconductor layer (3) which is not depleted, thereby increasing the electric potential, and causing the current to increase suddenly when the lateral NPN transistor, comprising the n+ type drain area (6) as a collector, the bottom of the P-type silicon semiconductor layer (3) as a base, and the n+ type source area (5) as an emitter, is made conductive by surmounting the electric potential trouble in the forward direction between the bottom of the P-type silicon semiconductor layer (3) and the n+ type source area (5). Because the current caused by the conduction of this lateral NPN transistor is added to the current flowing through the ordinary channel area (4), a "kink" effect takes place where bends are specific to the drain current-drain voltage characteristic of the MOSFET as illlustrated in FIG. 6. Because such kink effect, like the mentioned punch through, restricts the voltage that can be applied to the n+ type drain area (6), the dielectric strength between the n+ type source area (5) and the n+ type drain area (6) is caused to be reduced.

Now, if the P-type silicon semiconductor layer (3) is thin (500 to 1500 Å) and when the gap between the n+ type source area (5) and the n+ type drain area (6) is reduced, the voltage to be applied to the n+ type drain area (6) is increased, the depletion layer in the vicinity of the n+ type drain area (6) is expanded toward the n+ type source area (5), and the entirety of the P-type silicon semiconductor layer (3) is made to have a depletion layer. After the P-type silicon semiconductor is provided with the depletion layer, the electric trouble between the P-type silicon semiconductor layer (3) and the n+ type source area (5) is reduced and the election in the n+ type source area (5) tries to flow into the depletion layer, but the electron flowing into the depletion layer is controlled by the voltage applied to the gate electrode (8) because the P-type silicon semiconductor layer (3) is thin, thereby allowing the current to flow into the channel area (4) only. Therefore, when the P-type silicon semiconductor layer (3) is thick, there occurs no punch through which causes the current to flow out in the deep area of the depletion layer.

As with the case wherein the P-type silicon semiconductor layer (3) is relatively thick, the voltage that is applied to the n+ type drain area (6) rises, the in the channel area (4) is accelerated by the high electric field appearing in the depletion layer in the vicinity of the n+ type drain area (6) so as to be injected into the depletion layer in the vicinity of the n+ type drain area (6), ionization is caused by collision to generate a lot of pairs of electron and positive hole, and the generated electron flows into the n+ type drain area (6). However, the positive hole flows in from the depletion layer in the vicinity of the n+ type drain area (6) to be accumlated on the bottom of the P type silicon semiconductor layer (3) wherein the entirety thereof is depleted and floating, thereby increasing the electric potential, and causing the already reduced electric trouble between the P-type silicon semiconductor layer (3) and the n+ type source area (5) to be reduced further. As a result of further reduced electric trouble between this P-type silicon semiconductor layer (3) and the n+ type source area (5), the positive hole generated by the ionization caused by collision in the depletion layer is not controlled by the voltage applied to the gate electrode but flows into the n+ type source area (5) while the electron in the n+ type source area (5) flows suddenly into the channel area (4) and may cause the current flowing through the channel area (4) to increase.

That is, even if the P type silicon semiconductor layer (3) is thin and when the gap between the n+ type source area (5) and the n+ drain area (6) is reduced, the punch through or kink does not occur. However, a problem exists in that the current flowing through the channel area (4) is increased to restrict the voltage that can be applied to the n+ type drain area (6), whereby a drawback in which the dielectric strength between the n+ type source area (5) and the n+ type drain area (6) is caused to be undesirably reduced.

A further problem is involved wherein it is impossible to reduce the gap between the n type source area (5) and the n type drain area (6), making it difficult to promote the miniaturization of the MOSFET.

SUMMARY OF THE INVENTION

An object of the present invention is, therefore, to solve the problems as stated above and to provide a MOSFET which sufficiently increases the dielectric strength between the source area and the drain area and is suitable for minituarization, and in particular to provide a MOSFET whose channel area is provided with thin film.

Means of Solution to the problems

In a MOS type field effect transistor according to the present invention, a concave part provided with an insulator therein is formed on one main surface of the silicon semiconductor substrate of a first conduction type, a cylindrical silicon semiconductor layer of the first conduction type is formed to have the outer circumferential surface of such concave part as a channel area, one source/drain area of a second conduction type is formed annularly on one main surface of the silicon semiconductor substrate so as to contact one end of the channel area and outwardly from the outer circumferential surface of the silicon semiconductor layer, the other source/drain area of the second conduction type is formed on the upper end of the silicon semiconductor layer so as to contact the other end of the channel area, and a cylindrical gate electrode is formed with respect to the outer circumferential surface of the silicon semiconductor layer by means of a gate insulation film.

Furthermore, with respect to the manufacturing method of a MOS type field effect transistor in accordance with the present invention, one main surface of the silicon semiconductor substrate of the first conduction type is etched to form a trench thereon, an insulator layer is formed by filling the trench with an insulator, one main surface of the silicon semiconductor substrate is etched to form a cylindrical silicon semiconductor layer of the first conduction type outwardly from the side of the insulator, one annular source/drain area of the second conduction type is formed on one main surface of the silicon semiconductor substrate outwardly from the outer circumferential surface of the silicon semiconductor layer, the other source/drain area of the second conduction type is formed on the upper end of the silicon semiconductor layer, and a cylindrical gate is formed with respect to the outer circumferential surface of the silicon semiconductor layer by means of the gate insulator film.

DESCRIPTION OF THE PREFERRED EMBODIMENTS

In the drawings, reference numeral (21) indicates the P-type silicon semiconductor substrate, numeral (22) indicates the insulator layer, numeral (23) indicates the P-type silicon semiconductor layer, numeral (24) indicates the channel area, numeral (25) indicates the n+ type source area, numeral (26) indicates the n+ type drain area, numeral (27) indicates the gate oxide film, numeral (28) indicates the gate electrode, and numeral (30) indicates the conduction layer of titanium, nickel and gold.

In the drawings, the same or the like reference numerals are designated to like parts.

In the MOS type field effect transistor of the above construction, when particles of the pair of electron are generated by collision ionization occurring in the silicon semiconductor layer, the particles having counter charge for the electric potential of a conduction layer flow from the cylindrical silicon semiconductor layer into the bottom of the silicon semiconductor substrate, thereby preventing the current flowing through the channel area from increasing.

In addition, the gap of the source/drain area is in longitudinal direction with respect to one main surface of the silicon semiconductor substrate, making the MOSFET suitable for miniaturization.

Figure 1A:
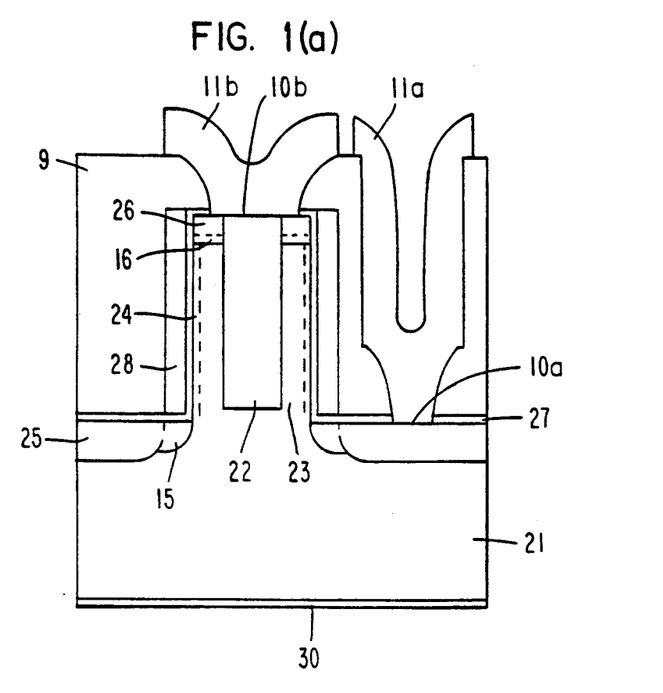
FIGS. 1(a), (b) are a structural sectional view and a plan view respectively illustrating an embodiment in accordance with the present invention.
Figure 1B:
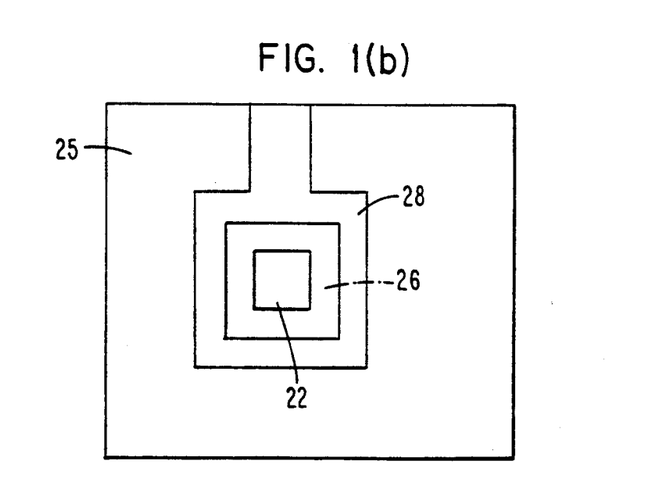

FIG. 1 is a structural sectional view and a plan view respectively illustrating an embodiment of the present invention. In this drawing, reference numeral (21) indicates a P-type silicon semiconductor substate having the density of $1 \times 10^{15} cm^{-3}$ and the specific resistance of $10\Omega.cm$; numeral (22) indicates a columnar insulator layer of 0.6 $\mu m$ in depth and 0.5 $\mu m$ in width formed vertically with respect to one surface of the foregoing P-type silicon semiconductor substrate; numeral (23) indicates a P-type silicon semiconductor layer of about 0.6 $\mu m$ in depth and 500 to 1500 Å in width formed cylindrically in the 500 to 1500 Å area outwardly from the side of the foregoing insulator layer (22); numeral (24) indicates a channel area having the density of $1 \times 10^{16}$ to $1 \times 10^{17} cm^{-3}$ formed in the foregoing silicon semiconductor layer (23) by injecting boron ions diagonally with respect to the foregoing P-type silicon semiconductor layer (23) with the acceleration voltage of 10 to 30 Kev and the dose of $1 \times 10^{12}$ to $1 \times 10^{14} cm^{-2}$; numeral (15) indicates an n− type source area having the density of $1 \times 10^{17}$ to $1 \times 10^{19} cm^{-3}$ formed in the foregoing P-type silicon semiconductor substrate (21) by injecting phosphorus ions vertically with respect to the main surface of the foregoing P-type silicon semiconductor substrate (21) with the acceleration voltage 80 Kev and the dose $1 \times 10^{13} cm^{-2}$; numeral (25) indicates an n+ type source area having the density $1 \times 10^{19}$ to $1 \times 10^{21} cm^{-3}$ formed in the foregoing P-type silicon semiconductor substrate (21) by injecting arsenic ions vertically with respect to the main surface of the foregoing P-type silicon semiconductor substrate (21) with the acceleration voltage of 40 Kev and the doses of $5 \times 10^{15} cm^{2}$, and wherein n type source area (25) and the n− type source area (15) of above arrangement form the source area of double diffusion structure. Numeral (16) indicates an n− type drain area having the density of $1 \times 10^{17}$ to $1 \times 10^{19} cm^{-3}$, formed in the foregoing P-type silicon semiconductor layer (23) by injecting phosphorus ions vertically with respect to the surface of the foregoing P-type silicon semiconductor layer (23) with the acceleration voltage of 80 keV and the dose of $1 \times 10^{13} cm^{-2}$; numeral (26) indicates an n+ type drain area having the density of $1 \times 10^{19}$ to $1 \times 10^{21} cm^{-3}$ formed in the foregoing P-type silicon semiconductor layer (23) by injecting arsenic ions vertically with respect to the surface of the foregoing P-type silicon semiconductor layer (23) with the acceleration voltage of 40 keV and the dose of $5 \times 10^{15} cm^{-2}$, and the n+ type drain area (26) and the n− type drain area (16) of above arrangement constitute the drain area of double diffusion structure. Numeral (27) indicates a gate oxide film formed on one main surface of the foregoing P-type silicon semiconductor substrate (21), on the surface and the outer circumferential surface of the foregoing P-type silicon semiconductor layer (23); numeral (28) indicates a gate electrode formed cylindrically to surround over the outer circumferential surface of the foregoing P-type silicon semiconductor layer (23) by means of the foregoing gate oxide film (27); and numeral (30) indicates a conduction layer formed by metallizing titanium, nickel and gold all over the other main surface (rear side) of the foregoing P-type silicon semiconductor substrate (21).

Then, the manufacturing method of the MOSFET whose thin film channel area composed as described above, will be described with respect to the accompanying FIGS. 2(a) through 2(g).

Figure 2A:
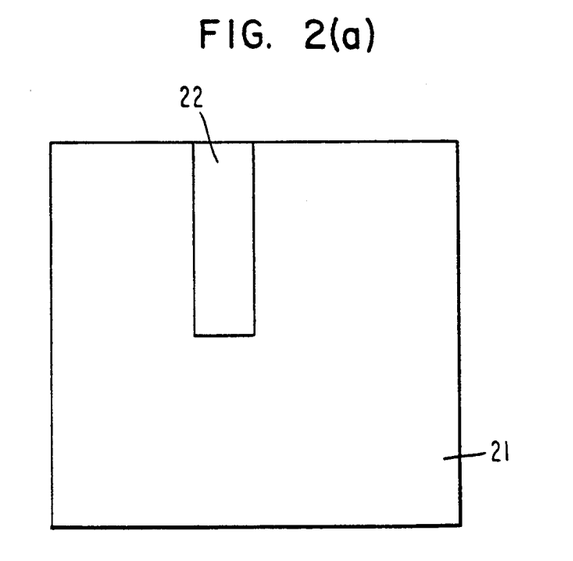
FIG. 2(a) through FIG. 2(g) are sectional views illustrating the manufacturing method of the embodiment shown in FIG. 1.

First of all, as shown in FIG. 2(a), a positive type photoresist (not illustrated) is formed on one main surface of a P-type silicon semiconductor substrate (21) having the density $1 \times 10^{15} cm^{-3}$ and the specific resistance of $10\Omega.cm$, the photoresist is exposed with respect to an area to form the insulator layer (22) therein, and the mask is formed by removing the exposed portion. Then, the mask is used for etching on one main surface of the P-type silicon semiconductor substrate (21) so as to form a columnar trench (groove) of 0.6 $\mu m$ in depth and 0.5 $\mu m$ in width vertically with respect to one main surface of the P-type silicon semiconductor substrate (21). Further, the trench is filled with silicon oxide film by CVD method to form a columnar insulator layer (22) of 0.6 $\mu m$ in depth and 0.5 $\mu m$ in width, and the photoresist used as the mask is removed.

Figure 2B:
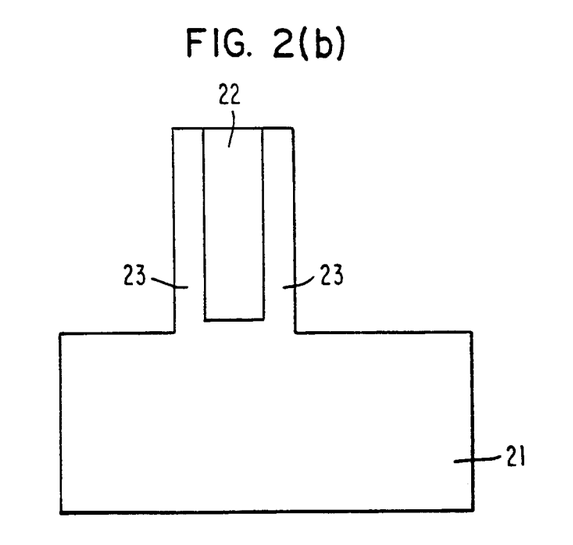

Then, as shown in FIG. 2(b), a positive type photoresist (not illustrated) is formed on the entirety of one main surface of the semiconductor substrate (21), the photoresist is exdposed outwardly from the surface of the insulator layer (22) and the side of the insulator layer (22) with respect to an area thereof except for the annular area of 500 to 1500 Å and the mask is formed by removing the exposed portion. Further, one main surface of the P-type silicon semiconductor substrate (21) is etched by using the mask, and the cylindrical P-type silicon semiconductor substrate (21) remains in the 500 to 1500 Å area outwardly from the insulator layer (22) and the side of the insulator layer (22) which are covered with unexposed photoresist. At this point, one main surface of the P-type silicon semiconductor substrate (21) is etched to 0.6 μm in depth so as to form the cylindrical P-type silicon semiconductor layer (23) of about 0.6 μm in depth and 500 to 1500 Å in width.

In order to form in a single process the P-type silicon semiconductor layer (23) with the width being as small as 500 to 1500 Å an exposure technology of extremely high accuracy is required. That is, the photo-engraving process which involves some technical difficulties is needed. In the embodiment according to the invention, the insulator layer (22), which does not have any influence on the operation of the MOSFET, is provided, the area adjacent the surface of this insulator layer (22) is formed as an area to be designated by exposure as well as an area to be designated by exposure with respect to the specified area of one main surface of the P-type silicon semiconductor substrate (21). Therefore, as compared with a case where the P-type silicon semiconductor layer (23) is formed independently, the area to be designated by exposure is expanded by the surface of the insulator layer (22), which in turn permits the used of photo-engraving process without involving technical difficulties, and the P-type silicon semiconductor layer (23) can be easily obtained.

Furthermore, by forming the area adjacent the insulator layer (22) annularly outward from the side of the insulator layer (22) and by forming the cylindrical P-type silicon semiconductor layer (23) using the entirety of the side of the insulator layer (22), it becomes possible to keep the volume of the insulator layer (22) to a minimum requirement level even though the surface area of the other source/drain area formed on the upper end of the P-type silicon semiconductor layer (23) during subsequent process, is large.

Figure 2C:
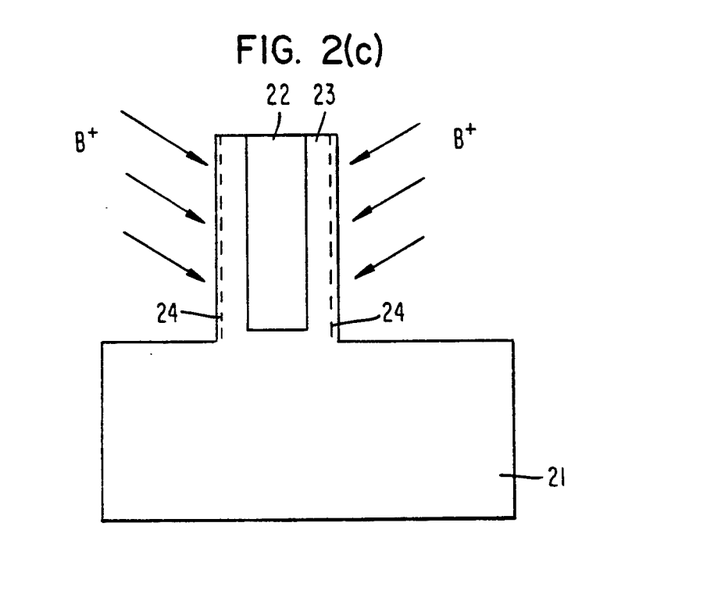

Then, as shown in FIG. 2(c), the channel area (24) having the density of $1 \times 10^{16}$ to $1 \times 10^{17} cm^{-3}$ is formed in the P-type silicon semiconductor layer (23) by injecting the boron ions diagonally with respect to the outer circumferential surface of the P-type silicon semiconductor layer (23) with the acceleration voltage of 10 to 30 keV and the dose of $1 \times 10^{12}$ to $1 \times 10^{14} cm^{-2}$. The born ions are injected to control the threshold voltage of the MOSFET.

Figure 2D:
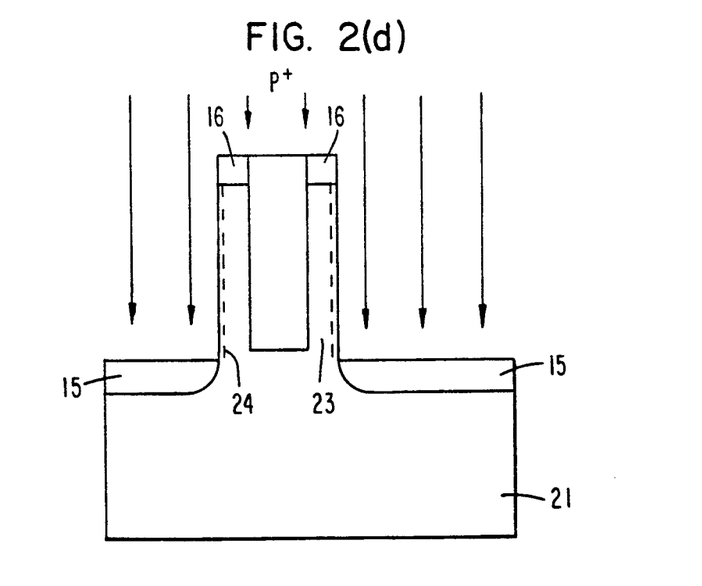

As shown in FIG. 2(d), the n⁻ type source area (15) and the n⁻ type drain area (16) having the density of $1 \times 10^{17}$ to $1 \times 10^{19} cm^{-3}$ are formed in the P-type silicon semiconductor substrate (21) and the P-type silicon semiconductor layer (23) by injecting phosphorus ions vertically with respect to one main surface of the P-type silicon semiconductor substrate (21), by injecting silicon semiconductor substrate (21) annularly outward from the outer circumferential surface of the P-type silicon semiconductor layer (23), and by injecting phosphorus ions vertically with respect to the surface of the P-type silicon semiconductor layer (23) with the acceleration voltage 80 keV and the dose $1 \times 10^{13} cm^{-2}$.

Figure 2E:
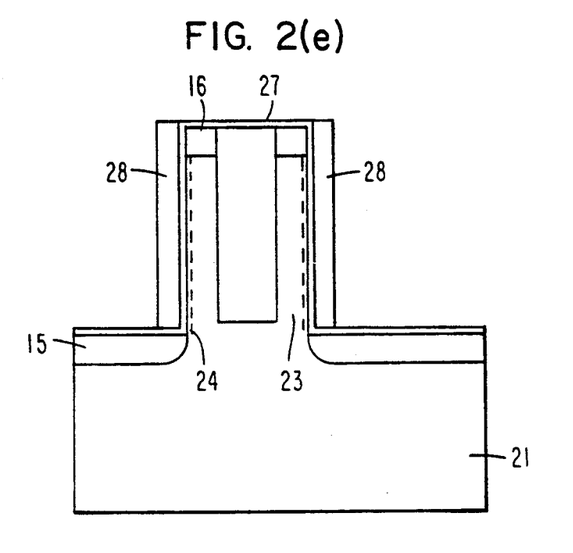

As shown in FIG. 2(e), the gate oxide film (27) is formed on one main surface of the P-type silicon semiconductor substrate (21) and the surface and the outer circumferential surface of the P-type silicon semiconductor layer (23). Following this process, a polysilicon layer is formed over the entire surface, and thereafter the cylindrical gate electrode (28) is formed by anisotropic etching to surround the outer circumferential surface of the P-type silicon semiconductor layer (23) by means of the gate oxide film (27).

Figure 2F:
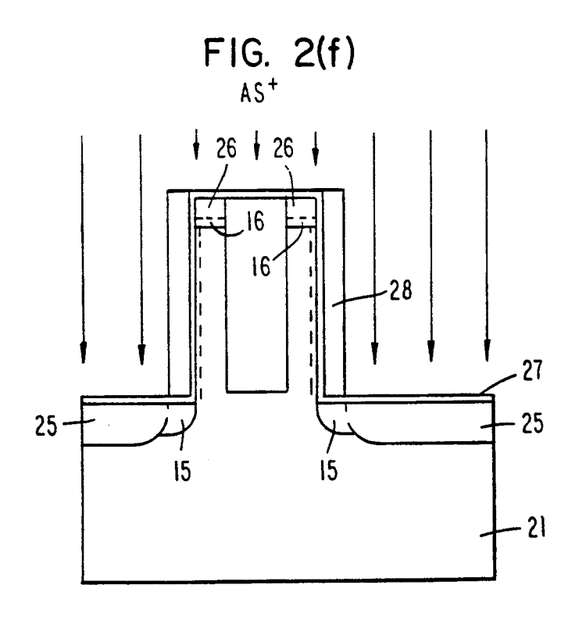

As shown in FIG. 2(f), the n⁺ type source area (25) and the N⁺ type drain area (26) having the density of $1 \times 10^{19}$ to $1 \times 10^{21} cm^{-3}$ are formed in the P-type silicon semiconductor substrate (21) and the P-type silicon semiconductor layer (23) by injecting arsenic ions vertically with respect to one main surface of the P-type silicon semiconductor substrate (21), by injecting arsenic ions on one main surface of the P-type silicon semiconductor substrate (21) annularly outward from the outer circumferential surface of the gate electrode (28), and injecting the arsenic ions vertically with respect to the surface of the P-type silicon semiconductor layer (23) with the acceleration voltage 40 keV and the dose of $5 \times 10^{15} cm^{-2}$.

Figure 2G:
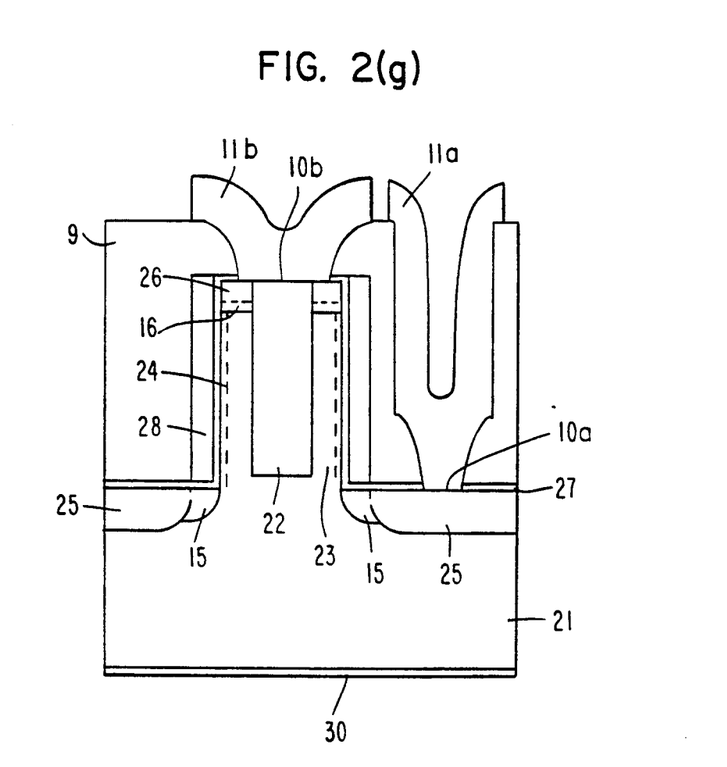

As shown in FIG. 2(g), the layer insulation film (9) comprising the BPSG film is formed on the entirety of one main surface of the P-type silicon semiconductor substrate (21) which includes the gate electrode (28). Then, the first contact hole (10a) and the second contat hole (10b) are provided on the layer insulation film (9) so as to form the first wiring (11a) and the second wiring (11b) of aluminum alloy respectively connected to the n⁺ type source area (25) and the n⁺ type drain aea (26). Then, after the conduction layer (30) is formed on the entirety of the other main source of the P-type silicon semiconductor substrate (21) by metallizing or depositing titanium, nickel and gold thereon, the n channel MOSFET having about 0.6 μm gap between the n⁻ type source area (15) and the n⁻ type drain area (16) is accomplished.

In the n channel MOSFET having the thin film channel area which is composed in the manner as described above, the ground potential (GND) is supplied to the P-type silicon semiconductor substrate (21) by means of the titanium, nickel ad gold conduction layer (30).

Accordingly, if the gap between the n⁻ type source area (15) and the n⁻ type drain area (16) is reduced, the voltage applied to the n⁺ type drain area (26) rises, and the depletion layer in the vicinity of the n type drain area (16) expands toward the n⁻ type silicon semiconductor layer (23) becomes depleted. After the P-type silicon semiconductor layer (23) is depleted of its entirety, the electric trouble between the P-type silicon semiconductor layer (23) and the n⁻ type source area (15) is reduced and the electron in the n⁻ type source area (15) and the electron in the n⁺ type source area (25) attempt to flow into the depletion layer, but the electron flowing into the depletion layer is controlled by the voltage applied to the gate electrode (28) because the P-type silicon semiconductor layer (23) is thin, thereby allowing the current to flow into the channel area (24) only.

The electric field intensity in the P-type silicon semiconductor layer (23) increases with an increase in the voltage applied to the n⁺ type drain area (26), and in particular, high electric field emerges in the depletion layer in the vicinity of the n⁻ type drain area (16). The electron in the channel area (24) is accelerated by the high electric field in the vicinity of the n⁻ type drain area (26) so as to be injected into the depletion layer in the vicinity of the n⁻ type drain area (16), causing the ionization by collision of the grid of silicon thereby to generate a number of pair of electron and positive hole. The generated electron is further drawn toward the high electric field in the vicinity of the n⁻ type drain area (16) and the most part of the electron flows through n⁻ type drain area (16) into the n⁺ type drain area (26). On the other hand, the positive hole flows from the depletion layer in the vicinity of the n⁻ type drain area (16) into the inner circumferential surface which contacts the insulator layer (22) of the P-type silicon semiconductor layer (23), wherein the entirety of the layer thereof is depleted and the electric trouble between the P-type silicon semiconductor layer (23) and the n⁻ type source area (15) is reduced. However, because the P-type silicon semiconductor substrate (21) is supplied with the ground potential and maintains low electric potential, the positive hole passes through the inner circumferential surface of the P-type silicon semiconductor layer (23) toward the P-type silicon semiconductor substrate (21). The positive hole having passed through the P-type silicon semiconductor layer (23) is drawn toward the area in the vicinity of the conduction layer (30) made of lower potential titanium, nickel and gold provided in the P-type silicon semiconductor substrate (21), and the most part of the positive hole flows into GND through the titanium, nickel and gold conduction layer (30).

That is, the positive hole generated in the depletion layer by collision and ionization does not flow into the n+ type source area (250, so that the current flowing through the channel area (24) will not increase. For this reason, it is possible to increase the upper limit of the voltage that can be applied to the n+ type drain area (26) and to sufficiently increase the dielectric strength between the n+ type source area (25) and the n+ type drain area (26).

Further, in the MOSFET having the thin film channel area composed in a manner as described above, the P-type silicon semiconductor layer (23) is formed vertically with respect to one main surface of the P-type silicon semiconductor substrat (21), the n⁻ type source area (15) and the n+ type source area (25) are formed annularly outward from the outer circumferential surface of the P-type silicon semiconductor layer (23), so that the n⁻ type drain area (16) and the n+ type drain area (26) are formed on the upper end of the P-type silicon semiconductor layer (23). Accordingly, the gap between the n⁻ type source area (15) and the n⁻ type drain area (16) is in the vertical direction with respect to one main surface of the P-type silicon semiconductor substrate (21), while the miniaturization of the MOSFET, which depends upon one main surface and the length in parallel direction of the P-type silicon semiconductor substrate (21), is not influenced, and therefore it is possible to obtain a MOSFET suitable for miniaturization thereof.

In the embodiment, the P-type silicon semiconductor substrate (21) in which n channel MOSFET is formed, is described, however, the same effects or advantages as those exhibited the foregoing embodiment can be achieved even though the P channel MOSFET is formed in an n-type silicon semiconductor substrate by reversing the polarity of the P-type and the n-type.

Figure 3:
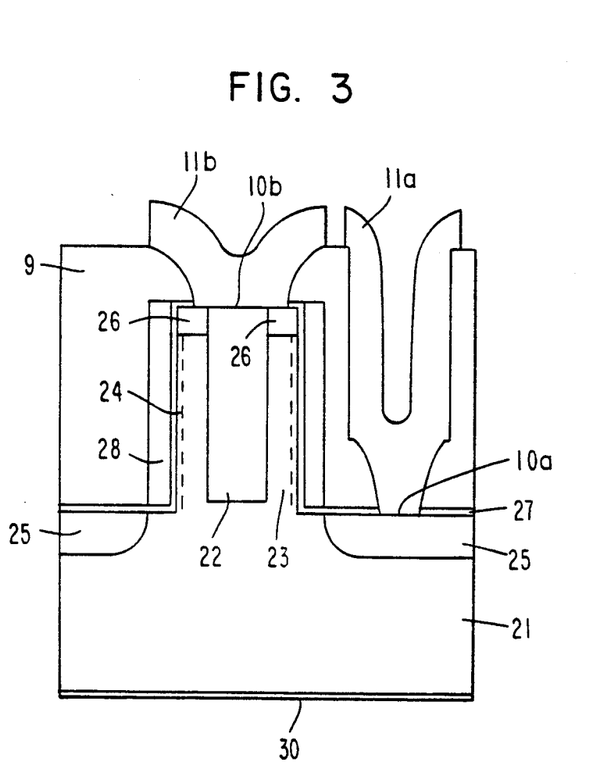
FIGS. 3 and 4 are respectively structural sectional views of the second and third embodiments in accordance with the present invention.

FIG. 3 shows a second embodiment in accordance with the invention, and in which the source area is formed with only the n+ type source area (25) having high impurity density (density of $1 \times 10^{19}$ to $1 \times 10^{21}$ cm⁻³) and the drain area is formed with only the n+ type drain area (26) having high impurity density (density of $1 \times 10^{19}$ to $1 \times 10^{21}$ cm⁻³), whereby the same effects or advantages as those exhibited by the foregoing first embodiment can be achieved.

Figure 4:
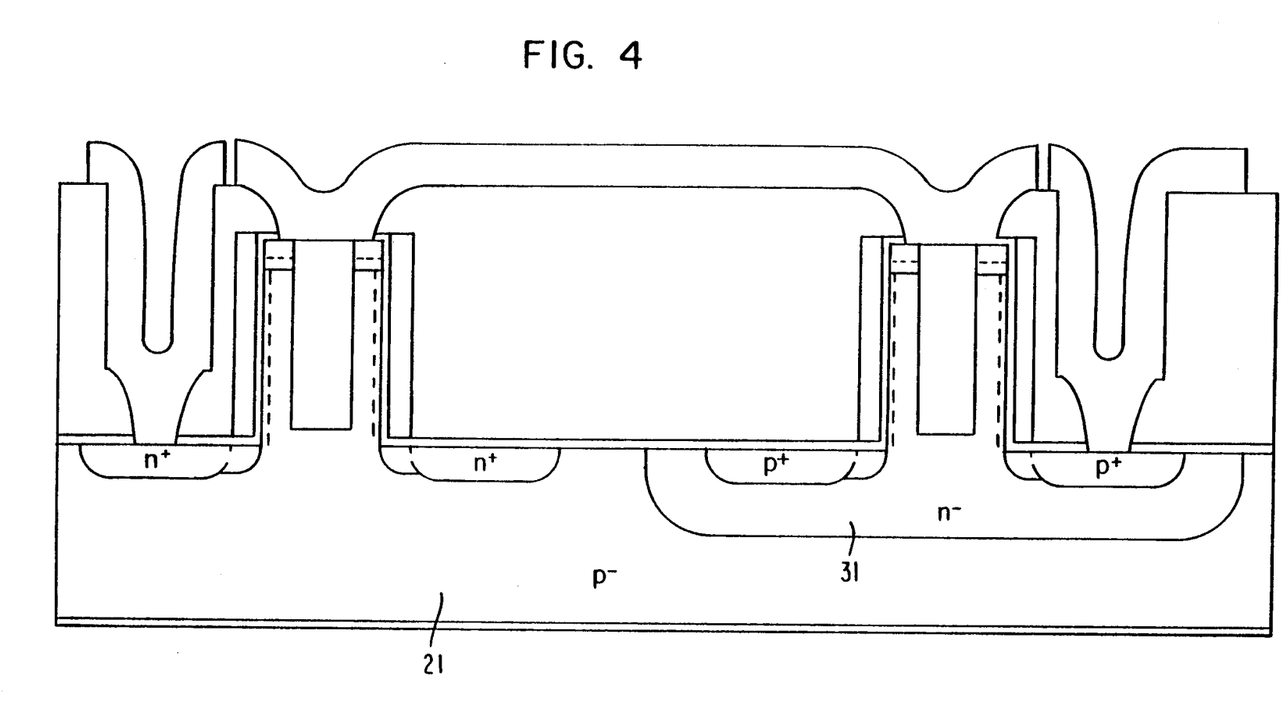

FIG. 4 is a third embodiment in accordance with the invention, and in which n well area (31) is provided in the P-type silicon semiconductor substrate (21), the P channel MOSFET is formed in the n well area (31). and the complementary type MOSFET (C-MOSFET) in the area of the P-type silicon semiconductor substrate (21) excepting the n well area (31) thereof, whereby the same effects or advantages as those exhibited by the above embodiment can be achieved.

As have been described so far, the present invention comprises a concave part provided with an insulator therein which is formed on one main surface of the semiconductor substrate of the first conduction type, the cylindrical semiconductor layer of the first conduction type having the outer circumferential surface of the concave part as the channel area, one source/drain area of the second conduction type is formed on one main surface of the semiconductor substrate so as to contact one end of the channel area and annularly outward from the outer circumferential surface of the semiconductor layer, the other source/drain area of the second conduction type is formed on the upper end of the semiconductor layer so as to contact the other end of the channel area, and the cylindrical gate electrode is formed with respect to the outer circumferential surface of the semiconductor layer by means of the gate insulation film, so that the channel current may be prevented from increase due to the particles of the pair of electron and positive hole generated in the semiconductor layer. Thus, it becomes possible to obtain a MOSFET having high dielectric strength between the source area and the drain area.

Furthermore, it is possible to obtain the MOSFET suitable for miniaturization, wherein the gap of the source area and the drain area is toward the longitudinal direction with respect to one main surface of the semiconductor substrate without affecting miniaturization of the MOSFET.

What is claimed is:

1. A MOS type field effect transistor comprising:
   a cylindrical semiconductor layer of a first conductivity type wherein a concave part provided with an insulator therein is formed continuously on a main surface of a semiconductor substrate of a first conductivity type, and a channel area is formed on an outer circumferential surface thereof;
   a first source or drain area of a second conductivity type formed on said main surface of said semiconductor substrate so as to contact one end of said channel area and extending annularly outward from said outer circumferential surface of said semiconductor layer;
   a second source or drain area of a second conductivity type formed on an upper end of said semiconductor layer so as to contact the other end of said channel area; and
   a cylindrical gate electrode formed with respect to said outer circumferential surface of said semiconductor layer by means of a gate insulation film.

2. The MOS type field effect transistor according to claim 1, further comprising:
   a first region of said second conductivity type formed on an inner circumferential surface of said first source or drain area so as to be interposed between said channel and said first source or drain area, and having a lower concentration of impurities than said first source or drain area; and
   a second region of said second conductivity type formed between said channel and said second source or drain area, and having a lower concentration of impurities that said second source or drain area.

3. The MOS type field effect transistor according to claim 1, further comprising:
  a conduction layer formed on another surface of said semiconductor substrate, different from said main surface, for providing a voltage potential to said semiconductor substrate.

4. A MOS type field effect transistor comprising;
  a semiconductor layer of a first conductivity type formed in a shape of a rectangular box, wherein a concave part provided with an insulator therein is formed continuously on a main surface of a semiconductor substrate of a first conductivity type, and a channel area is formed on an outer circumferential surface thereof;
  a first source or drain area of a second conductivity type formed on said main surface of said semiconductor substrate so as to contact one end of said channel area and extending outward from said outer circumferential surface of said semiconductor layer;
  a second source or drain area of a second conductivity type formed on an upper end of said semiconductor layer so as to contact the other end of said channel area; and
  a gate electrode formed in a shape of a rectangular box with respect to said outer circumferential surface of said semiconductor layer by means of a gate insulation film.

5. The MOS type field effect transistor comprising:
  a first cylindrical semiconductor layer of a first conductivity type wherein a concave part provided with an insulator therein is formed continuously on a main surface of a semiconductor substrate of a first conductivity type, and a first channel area is formed on an outer circumferential surface thereof;
  a first source or drain area of a second conductivity type formed on said main surface of said semiconductor substrate so as to contact one end of said first channel area and extending annularly outward from said outer circumferential surface of said semiconductor layer;
  a second source or drain area of a second conductivity type formed on an upper end of said first semiconductor layer so as to contact the other end of said first channel area; and
  a first cylindrical gate electrode formed with respect to said outer circumferential surface of said first semiconductor layer by means of a gate insulation film;
  a region of said second conductivity type formed in said semiconductor substrate, spaced apart from said first and said second source or drain area;
  a second cylindrical semiconductor layer of said second conductivity type wherein a concave part provided with an insulator therein is formed continuously on said main surface of said semiconductor substrate in said region of second conductivity, and a second channel area is formed on an outer circumferential surface thereof;
  a third source or drain area of said first conductivity type formed on said main surface of said semiconductor substrate in said region of second conductivity so as to contact one end of said second channel area and extending annularly outward from said outer circumferential surface of said second semiconductor layer;
  a fourth source or drain area of said first conductivity type formed on an upper end of said second semiconductor layer so as to contact the other end of said second channel area; and
  a second cylindrical gate electrode formed with respect to said outer circumferential surface of said second semiconductor layer by means of a gate insulation film.

* * * * *